(12) United States Patent
Reboud et al.

(10) Patent No.: US 10,490,976 B2
(45) Date of Patent: Nov. 26, 2019

(54) LASER SOURCE WITH A GERMANIUM-BASED SUSPENDED MEMBRANE AND AN INTEGRATED WAVEGUIDE THAT PARTICIPATES IN FORMING THE OPTICAL CAVITY

(71) Applicant: Commissariat A L'Energie Atomique et aux Energies Alternatives, Paris (FR)

(72) Inventors: Vincent Reboud, Paris (FR); Salim Boutami, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/145,471

(22) Filed: Sep. 28, 2018

(65) Prior Publication Data
US 2019/0097391 A1    Mar. 28, 2019

(30) Foreign Application Priority Data

Sep. 28, 2017   (FR) ...................................... 17 59017

(51) Int. Cl.
| | |
|---|---|
| *H01S 5/10* | (2006.01) |
| *H01S 5/30* | (2006.01) |
| *H01S 5/026* | (2006.01) |

(52) U.S. Cl.
CPC ............. *H01S 5/101* (2013.01); *H01S 5/026* (2013.01); *H01S 5/3027* (2013.01); *H01S 5/3031* (2013.01)

(58) Field of Classification Search
CPC ........ H01S 5/101; H01S 5/3031; H01S 5/026; H01S 5/3027
See application file for complete search history.

(56) References Cited

U.S. PATENT DOCUMENTS

| | | | |
|---|---|---|---|
| 2006/0153268 A1* | 7/2006 | Yu ...................... | G02B 6/12004 372/94 |
| 2017/0092809 A1 | 3/2017 | Reboud et al. | |

FOREIGN PATENT DOCUMENTS

| | | |
|---|---|---|
| EP | 3 151 266 A1 | 4/2017 |
| WO | WO 2013/007896 A1 | 1/2013 |

OTHER PUBLICATIONS

J. Petykiewicz et al. "Direct Bandgap Light Emission from Strained Germanium Nanowires Coupled with High-Q Nanophotonic Cavities", Nano Letters, vol. 16, No. 4, 2016, 6 pages (Year: 2016).*

(Continued)

*Primary Examiner* — Xinning (Tom) Niu
(74) *Attorney, Agent, or Firm* — Oblon, McClelland, Maier & Neustadt, L.L.P.

(57) ABSTRACT

A laser source including a germanium-based semiconductor layer, including a suspended membrane formed of a tensilely stressed central portion and including an optical amplification section, and a plurality of tensioning arms. It includes an integrated waveguide, which participates in forming an optical cavity and which is located level with the carrier layer and at distance from the suspended membrane, the waveguide including a coupling section located facing the optical application section, which is suitable for allowing evanescent-wave optical coupling to the latter, and at least one curved section, which extends the coupling section, and which is arranged so that the integrated waveguide is placed at distance, in orthogonal projection, from the tensioning arms.

14 Claims, 8 Drawing Sheets

(56) References Cited

OTHER PUBLICATIONS

French Preliminary Search Report dated Jun. 18, 2018 in French Application 17 59017, filed on Sep. 28, 2017 (with English Translation of Categories of cited documents & Written Opinion).

Gupta, S., et al. "A novel, highly-strained structure with an integrated optical cavity for a low threshold germanium laser", 2015 Conference on Lasers and Electro-Optics (CLEO), 2015, 2 pages.

Petykiewicz, J., et al. "Direct Bandgap Light Emission from Strained Germanium Nanowires Coupled with High-Q Nanophotonic Cavities", Nano Letters, vol. 16, No. 4, 2016, 6 pages.

Boztug, C., et al. "Strained-Germanium Nanostructures for Infrared Photonics", ACS Nano, vol. 8, No. 4, 2014, 16 pages.

Sun, X., et al. "Adiabaticity criterion and the shortest adiabatic mode transformer in a coupled-waveguide system", Optics Letters, vol. 34, No. 3, 2009, 3 pages.

* cited by examiner

LASER SOURCE WITH A GERMANIUM-BASED SUSPENDED MEMBRANE AND AN INTEGRATED WAVEGUIDE THAT PARTICIPATES IN FORMING THE OPTICAL CAVITY

TECHNICAL FIELD

The technical field of the invention is that of laser sources comprising a germanium-based suspended membrane the optical gain medium of which is located in a central portion that is tensilely stressed by tensioning arms.

PRIOR ART

In various optoelectronic or microelectronic applications it may be advantageous to use a layer made of a crystalline, and preferably single-crystal, semiconductor compound having a tensile mechanical stress. This is in particular the case of certain light sources the optical gain material of which has, when not stressed, an indirect energy-band structure, the band structure then being made direct by the application of a sufficient tensile stress. The crystalline semiconductor compound may be a germanium-based compound, for example germanium, germanium tin, or even silicon germanium.

FIG. 1 schematically illustrates a suspended-membrane laser source 1 according to an example of the prior art, such as described in the article by Petykiewicz et al. entitled *Direct Bandgap Light Emission from Strained Ge Nanowires*, Nano Lett., 2016, 16 (4), 2168-2173. The laser source 1 comprises a germanium-based semiconductor layer 10, the latter being structured to form a membrane suspended above a carrier layer. The suspended membrane comprises a central portion 20 that is placed under tension by lateral portions 30 that form tensioning arms. The central portion 20 forms the optical gain medium of the laser source 1, the latter being located in an optical cavity defined by two Bragg mirrors 52. These Bragg mirrors 52 are placed in the tensioning arms 30, and are formed by a periodic succession of localized etches in the semiconductor layer 10.

There is however a need to provide a laser source with a germanium-based suspended membrane having improved mechanical properties. There is also a need to provide such a laser source the optical and/or electronic properties of the suspended membrane of which are improved.

SUMMARY OF THE INVENTION

The objective of the invention is to at least partially remedy the drawbacks of the prior art, and to provide a laser source comprising a suspended membrane with improved mechanical properties, as well as with improved optical and/or electronic properties.

To this end, one subject of the invention is a laser source comprising a germanium-based semiconductor layer comprising a membrane suspended above a carrier layer, the suspended membrane being formed of:
- a central portion, which is tensilely stressed in a plane parallel to the carrier layer, comprising an optical amplification section that is suitable for producing light radiation by stimulated emission, and
- a plurality of lateral portions forming tensioning arms that are opposite one another with respect to the central portion, and that are arranged so as to keep the central portion suspended and tensilely stressed, the tensioning arms having an average width larger than an average width of the central portion.

According to the invention, the laser source furthermore comprises an integrated waveguide that participates in forming an optical cavity with at least the optical amplification section, said integrated waveguide being located level with the carrier layer and at distance from the suspended membrane, and comprising:
- a coupling section, which is located facing the optical amplification section, and which is suitable for allowing evanescent-wave optical coupling to the latter, and
- at least one curved section that extends the coupling section, and which is arranged so that the integrated waveguide is placed at distance, in orthogonal projection, from the tensioning arms.

The following are certain preferred but nonlimiting aspects of this laser source.

The laser source being suitable for emitting light radiation of emission wavelength $\lambda$, the integrated waveguide may have a minimum distance with respect to the tensioning arms, in orthogonal protection, larger than or equal to $\lambda/4$.

The curved section may have an average radius of curvature larger than or equal to $\lambda/4$. It may have an average radius of curvature smaller than or equal to $2\lambda$.

The integrated waveguide may have a ring longitudinal shape, and comprise two curved sections which extend the coupling section and are located on either side thereof, and a distal section which is connected to the coupling section by the curved sections.

The integrated waveguide may have an open longitudinal shape. It may comprise a first distal section which is connected to the coupling section by the curved section, and which comprises a first optical reflector.

The laser source may comprise a second optical reflector located in a tensioning arm opposite to the tensioning arm in proximity to which the first distal section is located, so that the optical cavity is defined by the first optical reflector located in the first distal section and by the second optical reflector located in the second tensioning arm.

The integrated waveguide may comprise a second distal section comprising a second optical reflector, said second distal section being separate from the first distal section and being connected to the coupling section by a second curved section, so that the optical cavity is defined by the first optical reflector located in the first distal section and by the second optical reflector located in the second distal section.

The coupling zone may comprise at least one coupling zone that has a transverse dimension that varies along the longitudinal axis of the integrated waveguide, so that an effective index of the optical mode supported by the coupling section passes locally from a value higher than an effective index of the optical mode supported by the optical amplification section to a value lower than the effective index of the optical modes supported by the optical amplification section.

The coupling zone may form an adiabatic mode transformer.

The coupling of the coupling zone may be partial so as to allow the light radiation to be extracted out of the optical cavity via the suspended membrane, or may be complete so as to allow the light radiation to be extracted out of the optical cavity by means of an extracting waveguide located level with the carrier layer and optically coupled to the integrated waveguide.

The suspended membrane may comprise two zones that are doped with opposite conductivity types extending at least partially into the lateral portions on either side of the optical amplification section, the latter comprising a material that is unintentionally doped or doped n-type.

The integrated waveguide may be located at distance, in orthogonal projection, from said doped zones.

The central portion may have an average tensile mechanical stress of a sufficient value to make its energy-band structure substantially direct in the optical amplification section.

The invention also relates to a process for fabricating a laser source according to any one of the preceding features, comprising the following steps:

i) producing the integrated waveguide in the carrier layer;
ii) producing the semiconductor layer comprising the membrane formed in the central portion and tensioning arms, so that the coupling section is located facing the optical amplification section and so that the tensioning arms are located at distance, in orthogonal projection, from the integrated waveguide;
iii) suspending the membrane, so that the central portion is tensilely stressed by the tensioning arms.

BRIEF DESCRIPTION OF THE DRAWINGS

Other aspects, aims, advantages and features of the invention will become more clearly apparent on reading the following detailed description of preferred embodiments thereof, which description is given by way of nonlimiting example with reference to the appended drawings, in which.

DETAILED DESCRIPTION OF PARTICULAR EMBODIMENTS

Figure 1:
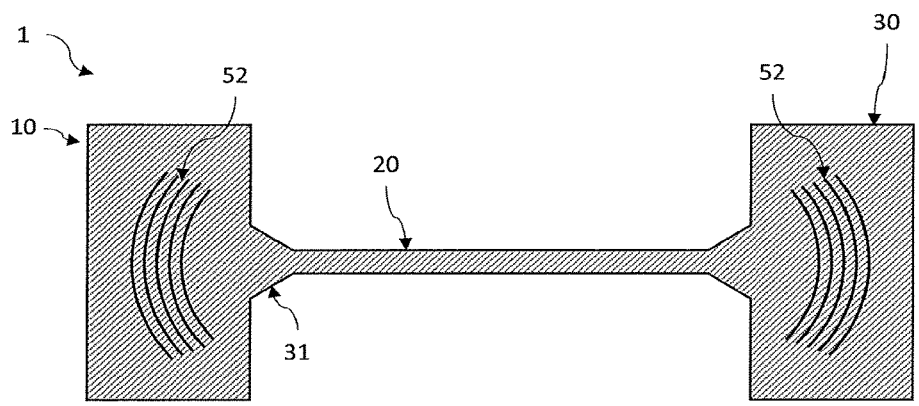
FIG. 1, which has already been described, is a schematic and partial top view of a suspended-membrane laser source according to an example of the prior art, in which the optical cavity is formed by Bragg mirrors located in the tensioning arms.

In the figures and in the rest of the description, the same references will be used to refer to elements that are identical or similar. In addition, the various elements are not shown to scale for the sake of clarity of the figures. Moreover, the various embodiments and variants are not exclusive from one another and may be combined together. Unless otherwise indicated, the terms "substantially", "about" and "of the order of" mean to within 10%. Moreover, the expression "comprising a" must be understood to mean "comprising at least one", unless otherwise indicated.

The invention relates to a laser source suitable for emitting coherent light radiation at an emission wavelength $\lambda$.

The laser source comprises a germanium-based suspended membrane, the membrane comprising a central portion that is suspended and placed under tension by lateral portions forming tensioning arms. The suspended membrane is made of a germanium-based compound, this compound being sufficiently tensilely stressed to allow the emission of light radiation via radiative recombination of electron-hole pairs. Preferably, the tensile mechanical stress is sufficient for the central portion to have a direct energy-band structure at least in a longitudinal section.

The central portion comprises an optical amplification section in which the gain medium is located, this optical amplification section being placed in a resonant optical cavity formed at least partially by an integrated waveguide. The optical cavity is then formed by the integrated waveguide and by at least the optical amplification section.

Thus, the optical cavity is a hybrid cavity, in so far as it is partially formed by the integrated waveguide, on the one hand, and at least by the optical amplification section of the suspended membrane, on the other hand. As described below, according to a first embodiment, the optical cavity is defined by the ring that the integrated waveguide forms. Furthermore, according to a second embodiment, the optical cavity is defined by optical reflectors, for example of the Bragg-mirror type, at least one of which is located in a distal section of the integrated waveguide. In this case, the optical cavity has an open longitudinal shape, in contrast to the ring longitudinal shape of the first embodiment.

The waveguide is said to be integrated in so far as it is located level with the carrier layer above which the membrane is suspended. The integrated waveguide is then located at distance, along an orthogonal axis, from the suspended membrane, and therefore from the central portion. It may be located in the carrier layer and may optionally open onto the upper face thereof. It may also be located on the upper face of the carrier layer.

The suspended optical amplification section is optically coupled to a coupling section of the integrated waveguide by evanescent-wave coupling. To this end, the coupling section is located facing the optical amplification section. By facing, what is meant is perpendicular to, or plumb with. The optical coupling is in particular permitted by the fact that the effective index of the optical mode supported by the coupling section is, at least locally, lower than the effective index of the optical mode supported by the central portion, thus allowing the, partial or complete, transfer of the optical mode, from the coupling section to the suspended optical amplification section, and vice versa.

In addition, the integrated waveguide comprises at least one curved section that extends the coupling section, and connects the latter to a distal section that participates in forming the optical cavity. The curved section is arranged so that the integrated waveguide is located at distance, in orthogonal projection, with respect to the tensioning arms. The same goes for the distal section. By orthogonal projection, what is meant is the projection, along an orthogonal axis, onto a plane in which the tensioning arms of the suspended membrane lie. Thus, the integrated waveguide is not located under the tensioning arms, and is therefore not covered thereby, even partially. In other words, in orthogonal projection onto the plane in which the suspended membrane lies, the integrated waveguide is located at a nonzero minimum distance with respect to the tensioning arms.

The semiconductor layer of the suspended membrane is germanium-based, i.e. the crystalline, and preferably single-crystal, semiconductor of the semiconductor layer is made of germanium and/or made of one or more germanium-based alloys, such as, for example, SiGe, GeSn, SiGeSn. Preferably, the germanium-based crystalline semiconductor of the semiconductor layer has, in the absence of tensile strain of its crystal lattice, an indirect energy-band structure. The tensile strain experienced by the germanium-based material may be sufficient for the band structure of the latter to be substantially direct at least locally. As a variant, the germanium-based material may have, at least locally, an n-type doping concentration and a tensile strain that are sufficient to allow the emission of light radiation. In this particular case, the tensile strain and the n-type doping allow the L valley (or indirect valley) to be populated and the Γ valley (or direct valley) to be at least partially populated with electrons. The radiative recombination between the charge carriers located in the valence band and the direct valley of the conduction band is then possible.

By stressed portion, what is meant is a layer portion made of a crystalline semiconductor compound having a tensile or compressive mechanical stress, leading to a strain of the unit cells of its crystal lattice. The portion is tensilely stressed when it experiences a mechanical stress that tends to stretch the unit cells of the lattice in a plane. In the context of the invention, the central portion of the suspended membrane is tensilely stressed in the plane of the semiconductor layer, this meaning that its lattice parameter has an effective value higher than its natural value when the semiconductor compound is relaxed (i.e. not stressed). In the rest of the description, unless otherwise indicated, the stress in question is oriented in the plane of the semiconductor layer.

By direct or substantially direct band structure, what is meant is that the energy minimum $E_{BC,L}$ of the conduction band of the L valley (or indirect valley) is higher or substantially equal to the energy minimum $E_{BC,\Gamma}$ of the conduction band of the Γ valley (or direct valley); in other words: $\Delta E = E_{BC,L} - E_{BC,\Gamma} \geq 0$. By substantially equal, what is meant here is that this energy difference is of the order of magnitude or lower than kT, where k is Boltzmann's constant and T the temperature of the material. The semiconductor layer is based on germanium the energy-band structure of which is indirect outside of the central portion of the suspended membrane (in other words $\Delta E < 0$) and the central portion has a sufficient tensile strain to, preferably, make its energy-band structure direct at least locally.

Figure 2A:
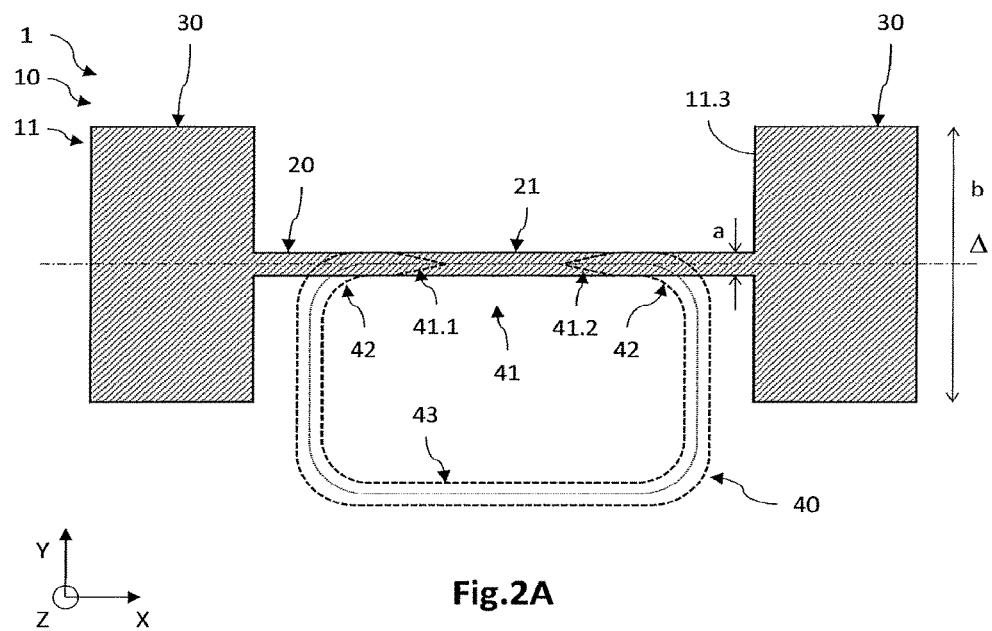
FIGS. 2A and 2B are schematic and partial top and longitudinal cross-sectional views of a suspended-membrane laser source according to a first embodiment, comprising an optical cavity partially formed by an integrated ring waveguide.
Figure 2B:
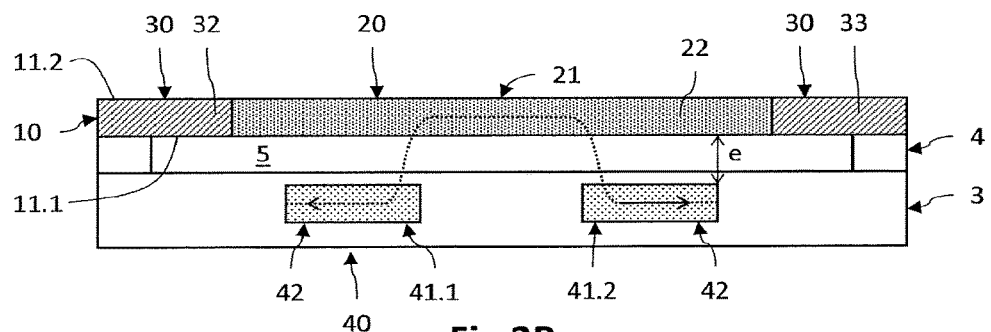

FIGS. 2A and 2B are schematic partial views of a first embodiment of a laser source 1 with a germanium-based suspended membrane, the laser source comprising an optical cavity that is at least partially formed by an integrated ring waveguide 40. FIG. 2A is a top view and FIG. 2B is a longitudinal cross-sectional view of the XZ cross-sectional plane extending along the axis Δ.

Here, and for the rest of the description, a three-dimensional direct coordinate system (X, Y, Z) is defined in which the X and Y axes form a plane parallel to the plane of a carrier layer 3, and in which the Z axis is oriented in the direction of the thickness of the layers. In the rest of the description, the terms "lower" and "upper" are understood to be relative to a position that increases with distance from the carrier layer 3 in the +Z direction.

The laser source 1 comprises a stack formed of a carrier layer 3, of a sacrificial layer 4 and of a semiconductor layer 10 made of a preferably single-crystal, crystalline semiconductor compound. The carrier layer 3 is preferably made of silicon oxide $SiO_x$ (e.g. $SiO_2$) but may be made of a material chosen from silicon, sapphire, borosilicate, silica, glass, quartz or any other suitable material. It is chosen to be made of a material having a refractive index lower than that of the integrated waveguide 40. The sacrificial layer 4 may be made of a material chosen from an oxide or nitride of silicon, inter alia. The semiconductor layer 10 is germanium-based, i.e. made of germanium and/or of its alloys. The sacrificial layer 4 may have a thickness of about a few tens of nanometres to a few microns. The carrier layer 3 may have a thickness of a few tens of nanometres to a few hundred microns.

The semiconductor layer 10 is formed of a structured part 11 suspended above the carrier layer 3 and of a peripheral part (not shown) that encircles the structured part 11. The peripheral part rests on the sacrificial layer 4, the latter forming a cavity 5 located under the structured part 11. The structured part 11 comprises a central portion 20 that is connected to the peripheral part by lateral portions 30 forming tensioning arms. The central portion 20 may have a shape, in the (X, Y) plane, that is substantially square, and preferably rectangular, and of width of a few hundred nanometres to a few microns. The semiconductor layer 10 may have a thickness of about a few tens of nanometres to a few microns, or even more, depending on the optical properties desired for the resonant optical mode. In the structured portion 11, the suspended membrane has a lower face 11.1 that is oriented toward the carrier layer 3, and an opposite upper face 11.2, and lateral flanks 11.3 that connect the lower and upper faces 11.1, 11.2 to each other.

Two lateral portions 30 are produced that each connect a border of the central portion 20 to the peripheral part. They are arranged with respect to the central portion 20 so as to define at least one substantially rectilinear longitudinal strain axis Δ. Thus, the central portion 20 experiences a uniaxial tensile strain along the strain axis Δ, the latter coinciding with the longitudinal axis of the central portion 20 and with the longitudinal axis of the lateral portions 30. The areal dimension in the XY plane, and in particular the width of each lateral portion 30, is such that the lateral portions 30 have a negligible strain with respect to that experienced by the central portion 20. More precisely, the local strain greatly decreases with distance from the stressed portion 20, so that the average strain experienced by the lateral portions 30 is almost negligible. The lateral portions 30 here have a rectangular shape, but other shapes are possible, for example a trapezium shape the width of which continually increases with distance from the central portion 20 (see FIG. 4A). The lateral portions 30 may comprise an intermediate part 31, referred to as a junction, located between the central portion 20 and a wider part of large width of the lateral portion (see FIG. 4). The junctions 31 have a width in the XY plane that increases with distance from the central portion 20.

The central portion 20 is a tensilely stressed portion, i.e. it has a strain of its crystal lattice by natural increase of the lattice parameter. The lateral portions 30 allow the initial tensile-stress value in the central portion 20 to be increased, preferably without however themselves experiencing a significant mechanical stress. They thus form tensioning arms 30. To this end, the tensioning arms 30 and the central portion 20 are dimensioned so that the average width "b" of the tensioning arms 30 is larger than the average width "a" of the central portion 20, and preferably ten times larger than the latter. By width, what is meant is the local dimension between the opposite lateral flanks of a portion or of an arm, in the XY plane. The thickness is the local dimension between the lower and upper faces along the Z axis. The central portion 20 has a longitudinal dimension of length, here oriented along the X axis, which coincides with the strain axis Δ, and transverse dimensions of width along the Y axis and of thickness along the Z axis. Preferably, the central portion 20 has transverse dimensions of width and of thickness that are constant over all its length, so as to make the tensile mechanical stresses experienced by the central portion 20 uniform. It may nevertheless have a variable width facing mode transformers 41.1, 41.2 (which are described below) in order to facilitate the local optical coupling between the integrated waveguide 40 and the central portion 20.

The structuring of the suspended membrane may have been carried out so as to control the value of the amplification of the tensile stress of the central portion 20, i.e. the amplification obtained during the production of the cavity 5 and therefore during the suspension of the membrane. To this end, the dimensional parameters of the structured part 11, for example the widths and lengths of the central portion 20 and of the tensioning arms 30, are determined beforehand. By way of example, in the case of a rectangular central portion 20, of length L and of constant average width a, and of rectangular tensioning arms 30 of length B/2−A/2 and of constant width b, an amplification factor f relating the final tensile stress $o^{-f}$ of the central portion 20 to the initial tensile stress $o^{-i}$ may be expressed by the following relationship, which was formulated in the article by Süess et al. entitled *Analysis of enhanced light emission from highly strained germanium micro bridges*, Nature Photon. 7, 466-472 (2013):

$$f = \frac{2L_{ps} + B}{B}\left(1 + \frac{L}{B-L}\right) / \left(\frac{a}{b} + \frac{L}{B-L}\right)$$

where $L_{ps}$ is the length of the suspended structured portion 11. Thus, depending on the dimensional parameters of the structured portion 11 of the semiconductor layer 10, it is possible to control the value of the amplification of the tensile stress applied to the central portion 20 during the production of the cavity 5. The amplification factor may also be estimated by means of a numerical simulation software package such as COMSOL Multiphysics.

The germanium-based crystalline material of the semiconductor layer 10 has, in the absence of tensile mechanical stresses, an indirect energy-band structure. The germanium-based material located in the central portion 20 then experiences a sufficient tensile stress for its energy band structure to be substantially direct. By way of example, the suspended membrane is made of germanium and the central portion 20 has a length of about 15 µm and transverse dimensions of width and of thickness that are constant and about 600 nm. The tensioning arms 30 have a rectangular shape of width of about 55 µm for a thickness of about 600 nm. The central portion 20 then has a uniform tensile strain, of the order of about 5.2%. The energy-band structure of the germanium in the central portion 20 is then substantially direct.

As mentioned above, the laser source 1 comprises a germanium-based gain medium 22 that is located in a longitudinal section 21, called the optical amplification section, of the central portion 20. The gain medium 22 is furthermore located in the resonant optical cavity, which has a ring longitudinal shape in the first embodiment. This optical cavity is formed by the integrated ring waveguide 40 and by the suspended optical amplification section 21, which is optically coupled to the ring 40 by evanescent-wave coupling.

The gain medium 22 is located in a longitudinal part 21 of the central portion 20, facing which is located a coupling section 41 of the integrated waveguide 40. This part is thus called the longitudinal, or suspended, optical amplification section 21. It is preferably located at the centre of the central portion 20, and substantially does not extend out of the central portion 20. Thus, the optical amplification section 21 is located in a stressed portion the mechanical tensile stresses of which are substantially uniform, and of a value such that, preferably, the energy-band structure is substantially direct. As a variant, the stressed portion in which the optical amplification section 21 is located may not have a substantially direct band structure, but may be doped n-type with a sufficient doping concentration to allow the emission of light radiation. The fact that the central portion 20 is more tensilely stressed in the tensioning arms 30, the mechanical stresses of which may be negligible, results in a narrowing of the bandgap of the central portion 20 with respect to the tensioning arms 30, this allowing the charge carriers injected into the central portion 20 to be confined.

The gain medium 22 is suitable for emitting light radiation the emission spectrum of which has a peak centred on the wavelength λ. The emission wavelength λ is inversely proportional to the bandgap Eg of the semiconductor compound that forms the gain medium 22, and may be substantially equal to 1.24/Eg, where Eg is expressed in electron volts and depends on the value of the tensile strain, and where the wavelength λ is expressed in microns. The value of the bandgap may be estimated depending on the tensile strain, as described in the publication by Guilloy et al. entitled *Germanium under high tensile stress: Non-linear dependence of direct band gap vs strain*, ACS Photonics 2016, 3, 1907-1911. By way of example, the emission wavelength λ of a laser source 1, the suspended membrane of which is made of germanium stressed with a tensile stress of the order of about 5.2%, may be longer than or equal to 1.6 µm, and for example comprised between 2 µm and 6 µm.

The central section 20 of the suspended membrane is suitable for supporting the optical mode produced by the gain medium 22 and propagating in the resonant optical cavity. It thus forms the core of a suspended waveguide 20, encircled by a low-index optical medium (vacuum, gas, encapsulation material, etc.) that forms the cladding of the suspended waveguide 20. By way of example, the central portion 20 may be dimensioned so that the guided optical mode is polarized essentially in transverse-electric (TE) mode, i.e. so that it has a polarization plane substantially parallel to the plane of the guide. To this end, it has a width larger than its thickness. The central portion 20 may, as a variant, be dimensioned so that its thickness is larger than its width, this implying that the optical signal is essentially polarized in transverse-magnetic (TM) mode. It may support both a TE mode and a TM mode when its transverse dimensions of width and of thickness are of the same order of magnitude or are large with respect to the wavelength. The transverse dimensions of height and of width may be of the order of a few hundred nanometres to a few microns. Its length, i.e. the length of the central portion 20 bounded by the junctions with the tensioning arms 30, may be of the order of a few microns to a few hundred microns, depending on the number of structural defects potentially present in the central portion 20. Preferably, the length is of the order of around ten to a few tens of microns, for example is comprised between 10 µm and 50 µm, and for example is equal to about 20 µm.

Preferably, the gain medium 22 is an intrinsic zone of the central portion 20, i.e. an unintentionally doped zone. It may be located between two doped zones 32, 33 that extend in the tensioning arms 30 up to in contact with the intrinsic zone 21. These doped zones 32, 33, which are for example n- and p-doped, are optional but allow the injection of charge carriers into the gain medium 22 to be improved. More precisely, the doped zones 32, 33 are located in the tensioning arms 30, so that a p-doped zone 32 is located in a first tensioning arm 30, and an n-doped zone 33 is located in a second tensioning arm 30 opposite to the first. Each doped zone 32, 33 may solely be located in a tensioning arm 30, or may also extend into the central portion 20 up to the gain medium 22. By way of illustration, the gain medium 22 may be made of intrinsic germanium having a tensile strain of about 5.2%. As a variant, the gain medium 22 may be doped n-type. In this case, the tensile strain of the germanium may be lower, for example of the order of 3.5% for a doping concentration of about $10^{19}$ cm$^{-3}$, thus allowing the emission of the light radiation. The zone 33 that is doped n-type then has a higher doping concentration than that of the gain medium 22.

Moreover, two electric pads 6 (see FIG. 3A and 3B) are provided in contact with the tensioning arms 30 on either side of the central portion 20; for example one makes contact with the p-doped zone 32 and the other makes contact with the n-doped zone 33. Thus, the application of an electric bias to the tensioning arms 30, and where appropriate to the doped zones, allows the gain medium 22 to be pumped electrically and therefore light radiation to be emitted. Moreover, low-index layers (not shown) may be placed so as to encircle the gain medium 22 and thus to space the optical mode with respect to the electrical pads 6, thus allowing optical losses to the limited.

Figure 3A:
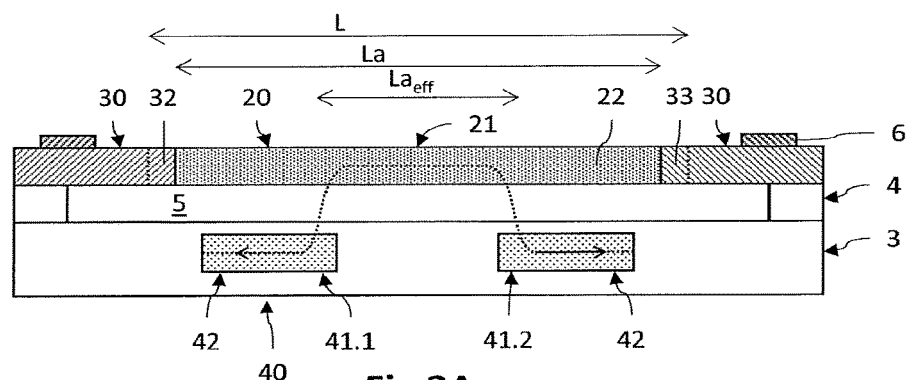
FIGS. 3A and 3B are longitudinal cross-sectional views of the laser source according to the first embodiment, which illustrate two examples of embodiments of the suspended optical amplification section such as illustrated in FIG. 2B.
Figure 3B:
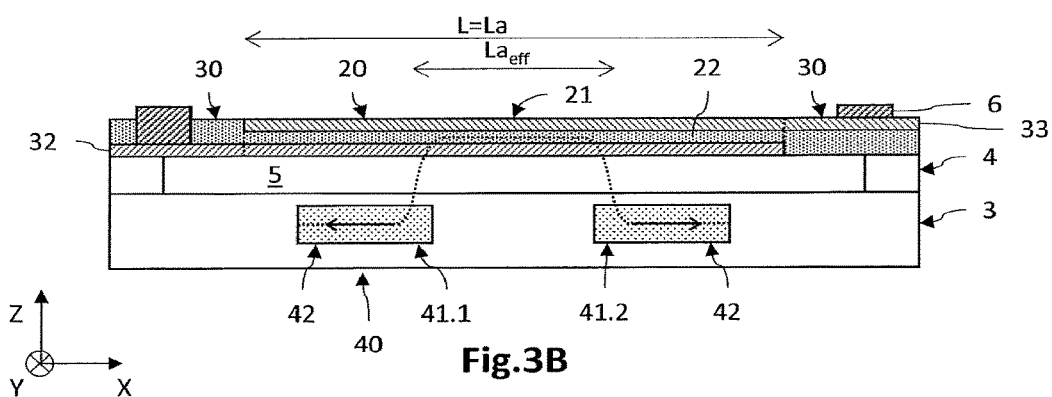

FIGS. 3A and 3B are longitudinal cross-sectional views schematically illustrating two examples of the laser source 1 according to the embodiment.

In the example illustrated in FIG. 3A, the gain medium 22 is formed of a zone made of intrinsic germanium of the central portion 20. More precisely, the zone 22 made of intrinsic germanium extends over the entire thickness of the central portion 20 and is preferably positioned at the centre of the central portion 20. The p- an n-doped zones 32, 33 may have a respective doping concentration of the order of $10^{19}$ cm$^{-3}$, and for example comprised between about $5 \times 10^{18}$ cm$^{-3}$ and $5 \times 10^{19}$ cm$^{-3}$. They extend in the XY plane up to in contact with the intrinsic zone 22. In this example, the gain medium 22 is located in the centre of the central portion 20 and has a length La smaller than or equal to the length L of the central portion 20. It is therefore located in a zone in which the tensile mechanical stresses are substantially uniform and sufficient for the energy-band structure to here be substantially direct. In addition, the bandgap of the central portion 20, which is narrower than that of the tensioning arms 30, ensures carrier confinement. The p- and n-doped zones 32, 33 extend in the tensioning arms 30 up to in contact with the gain medium 22. In this example, the doped zones 32, 33 then partially extend into the central portion 20 up to the intrinsic zone 22. In this case, it is advantageous for the integrated waveguide 40 to not be facing, i.e. plumb with, the doped zones 32, 33, so as to thus limit the risk of optical losses. The suspended membrane thus forms a horizontal p-i-n junction. The length L is the length of the central portion 20, La is the length of the suspended optical amplification section 21 that comprises the intrinsic zone 22, and $La_{\mathit{eff}}$ is the effective optical amplification length, i.e. the length of the section 21 facing which is found the coupling section 41 of the integrated wave guide 40. As a variant, the gain medium 22 may not have a direct band structure, but is doped n-type with a doping concentration sufficient to allow the light emission, for example with a doping concentration of the order of $1 \times 10^{19}$ cm$^{-3}$. The n-doped zone 33 then has a doping concentration higher than that of the gain medium 22, for example of the order of $3 \times 10^{19}$ cm$^{-3}$.

In another example, illustrated in FIG. 3B, the suspended membrane comprises a vertical p-i-n junction the doped and intrinsic zones 32, 33 and 22 of which form a stack along the Z axis. The longitudinal extent of the intrinsic zone 22 located between the doped zones 32, 33 defines the length La of the optical amplification section 21. The horizontal p-i-n junction then comprises a lower zone 32, doped a first conductivity type, for example p-type, that is covered with an intrinsic intermediate zone 22 forming the gain medium, which itself is covered with an upper zone 33 that is doped a second conductivity type opposite to the first time, for example n-type. The p-doped lower zone 32 extends into one of the tensioning arms 30 and makes contact with a first biasing pad 6. The n-doped upper zone 33 extends into the other tensioning arm 30 and makes contact with a second biasing pad 6. The intrinsic zone 22 may furthermore comprise at least one quantum well located between two wider-bandgap barrier layers. By way of illustration, the one or more quantum wells may be made of GeSn and the barrier layers of SiGeSn. The upper and lower doped parts 32, 33 may be made of Ge. In this example, the gain medium 22 has a length La equal to the length L of the central portion 20. The doped zones 32, 33 then also extend into the central portion 20. As mentioned above, the gain medium 22 may not have a direct band structure, but is then doped n-type with a doping concentration sufficient to allow the light emission. The n-doped zone 33 then has a doping concentration higher than that of the gain medium 22.

The laser source 1 therefore comprises a resonant optical cavity. In the first embodiment, the optical cavity has a ring longitudinal shape. It is formed at least partially by the integrated ring waveguide 40 to which the suspended optical amplification section 21 of the central portion 20 is optically coupled. This optical amplification section 21 also participates in forming the optical cavity with the integrated waveguide 40.

The integrated waveguide 40 is a waveguide placed in the carrier layer 3, in the sense that at least its lateral faces and its lower face are encircled by the material of the carrier layer 3. It may be flush with the upper face of the care layer 3, or be covered by the latter. The integrated waveguide 40 is made of a material of high refractive index, and is encircled by a medium of low refractive index forming the cladding of the guide. This cladding is formed by the material of the carrier layer 3, which encircles the core, and by the material separating the core from the central portion 20. By way of example, the integrated waveguide 40 and the carrier layer 3 may be silicon-based. For example, the integrated waveguide 40 may be made of silicon, and the carrier layer 3 made of silicon oxide $SiO_2$. The integrated waveguide 40 may have transverse dimensions of width and of thickness such that the guided optical mode has the same TE and/or TM polarization as the mode guided in the suspended optical amplification section 21.

The integrated waveguide 40 extends longitudinally so as to form a ring, i.e. a loop. As mentioned below, the loop may be continuous or discontinuous. Generally, its longitudinal extent in the XY plane is the shape of a circle, of an oval, or of a rectangle with rounded corners, or may have a more complex shape, in particular in order to integrate additional optical functions (filtering function, modulation function, etc.).

Figure 4:
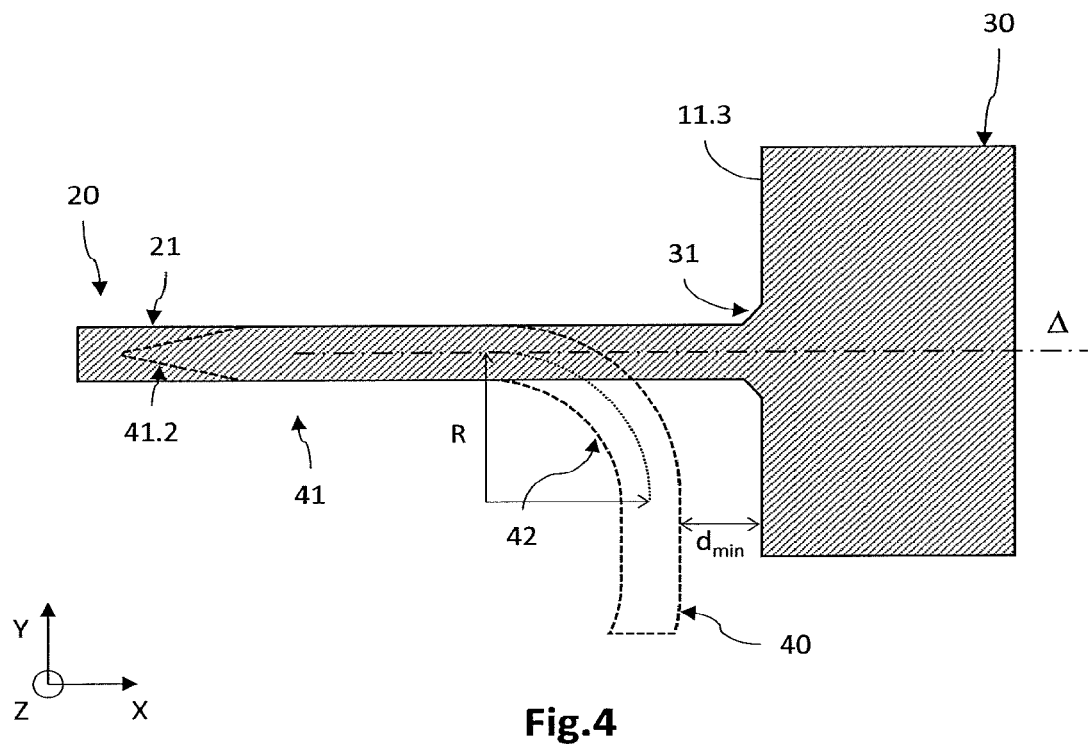
FIG. 4 is a top view of a part of the laser source according to the first embodiment illustrated in FIG. 2A, level with a curved section of the integrated waveguide.

FIG. 4 is a top view of a part of the laser source 1 according to the embodiment, level with the junction 31 of a tensioning arm 30 with the central portion 20. As illustrated in FIG. 2A and more precisely in FIG. 4, the integrated waveguide 40 comprises three main sections, namely a coupling section 41, here two curved sections 42 located at the longitudinal ends of the coupling section 41, and a distal section 43, i.e. a section that is distant with respect to the coupling section 41, and that is connected to the latter by the two curved sections 42.

The coupling section 41 is arranged so as to allow evanescent-wave optical coupling to the suspended optical amplification section 21. More precisely, the coupling section 41 is located facing, i.e. plumb with along the Z axis, and at distance from the suspended optical amplification section 21. They are therefore at least partially superposed with each other along the Z axis. The coupling section 41 may be continuous or discontinuous. It may have a local variation in its transverse dimensions, i.e. a variation in its local width and/or in its local thickness along its longitudinal axis, so that the effective index of the optical mode supported by the coupling section 41 passes locally from a value higher than the effective index of the optical mode supported by the suspended optical amplification section 21, to a value lower than the effective index of the optical mode supported by the suspended optical amplification section 21, in particular when it comprises mode transformers 41.1, 41.2.

Generally, the effective index $n_{eff}$ associated with an optical mode supported by a waveguide is defined as the product of the propagation constant $\beta$ and of $\lambda/2\pi$. The propagation constant $\beta$ depends on the wavelength $\lambda$ of the optical mode, and on the properties of the waveguide (refractive index and transverse dimensions). The effective index of the optical mode corresponds, in a certain way, to the refractive index of the waveguide 'seen' by the optical mode. It is usually comprised between the index of the core and the index of the cladding of the waveguide.

The spacing e (see FIG. 2B) between the coupling section 41 of the integrated wave guide 40 and the suspended waveguide 20 is nonzero and may be comprised between a few nanometres and a few hundred nanometres, and is for example comprised between 10 nm and 500 nm. This spacing is defined as the distance along the Z axis between the upper face of the integrated waveguide 40 and the lower face 11.1 of the suspended waveguide 20. It is chosen so as to allow the modal coupling between the integrated waveguide 40 and the suspended optical amplification section 21.

Optical coupling is understood to mean a local distribution of the energy of the resonating optical mode in the integrated waveguide 40 and in the suspended optical amplification section 21. Thus, locally, the resonating optical mode spreads both into the integrated optical waveguide 40 and into the suspended optical guide, thus locally forming a supermode. The local optical coupling is expressed by the phase match between the optical mode supported by the integrated waveguide 40 and that supported by the suspended waveguide 20, i.e. by the quasi-equality or even the equality between the propagation constants $\beta$ of the optical mode supported by the two waveguides 20, 40, translating into the quasi-equality or even the equality of the effective indices $n_{eff}$ of the optical modes supported by these waveguides 20, 40.

Preferably, as illustrated in FIGS. 2A and 3A, the coupling section 41 of the integrated waveguide 40 is discontinuous and comprises two mode transformers 41.1, 41.2, which are located facing the suspended optical amplification section 21. A mode transformer 41.1, 41.2 is defined as a tip-shaped zone of the integrated waveguide 40, i.e. a zone the width and/or thickness of which decreases to zero along its longitudinal axis. This longitudinal variation in at least one transverse dimension, here the width, results in a variation in the effective index of the guided optical mode, allowing the latter to be transmitted, minus losses, from one waveguide to the other. The mode transformers 41.1, 41.2 may be dimensioned to allow a complete adiabatic transmission of the optical mode between the waveguides 20, 40, as described in the publication by Sun et al. entitled *Adiabaticity criterion and the shortest adiabatic mode transformer in a coupled-waveguide system*, Opt. Lett, 34, 280 (2009). More precisely, the adiabatic character of a mode transformer may be expressed by an adequate longitudinal variation in at least one transverse dimension, its width for example. In such a case, the degree of coupling depends on the length of the mode transformer. The transfer of the optical mode is complete when its length is sufficient.

Thus, the coupling section 41 of the integrated waveguide 40 comprises a first mode transformer 41.1 the width of which continually decreases to zero in the +X direction, allowing the optical mode propagating in this direction to be transmitted, preferably adiabatically and completely, from the integrated waveguide 40 to the suspended optical amplification section 21. It comprises a second mode transformer 41.2, which is located in the longitudinal extension of the integrated waveguide 40, and the width of which continuously increases from zero in the +X direction, thus allowing the optical mode propagating in the suspended optical amplification section 21 to be transmitted, preferably adiabatically and completely, to the integrated waveguide 40. A guided mode travelling in the opposite direction will undergo the same optical transmission between the two waveguides 20, 40.

Thus, the optical mode may pass from the suspended section 21 performing the optical amplification function to the integrated ring waveguide 40 performing the optical resonator function and back again. The mode transformers 41.1, 41.2 are preferably adiabatic, and the coupling therebetween may be complete or partial depending on whether the light of the guided mode is extracted, i.e. transmitted out of the optical cavity, via the suspended membrane or via the integrated waveguide 40. In this example in which the light is extracted in the suspended membrane, at least one of the mode transformers 41.1, 41.2 is not adiabatic or has a coupling that is not complete. Thus, the optical mode is not completely transferred, thus allowing light to be extracted via the suspended membrane. By complete and partial optical coupling, what is meant is a degree of coupling higher and lower than 80%, respectively.

The integrated waveguide 40 furthermore comprises two curved sections 42, forming bends located at the longitudinal ends of the coupling section 41. These curved sections 42 have a longitudinal extent and an average radius of curvature R that are such that the integrated waveguide 40 does not extend under the tensioning arms 30, thus preventing leakage of the guided optical mode to the tensioning arms 30. The average radius of curvature R is defined from a longitudinal line (dot-dashed line) passing through the transverse centroids of the integrated waveguide 40. By transverse centroid, what is meant is the centroid associated locally with a right transverse section of the waveguide. Thus, the integrated waveguide 40 is located at distance from the tensioning arms 30, in orthogonal projection, i.e. in projection along the Z axis onto a main plane parallel to the XY plane in which it lies. There is therefore no even partial overlap between the integrated waveguide 40 and the tensioning arms 30. Thus, the minimum distance $d_{min}$ between a flank 11.3 of a tensioning arm 30 and a lateral face of the integrated waveguide 40 is larger than or equal to zero. Preferably, it is larger than or equal to $\lambda/4$, thus minimizing the risk of leakage of the guided optical mode to the tensioning arms 30.

Preferably, the average radius of curvature R is larger than or equal to $\lambda/4$, thus allowing optical losses in the curved sections 42 to be limited. By way of example, an average radius of curvature R substantially equal to $\lambda/4$ allows the optical losses to be limited to at most 0.05 dB per bend, the latter being defined as a quarter of a circle. By way of example, for a wavelength $\alpha$ of about 2.5 µm, a radius of curvature R of the order of 1 µm allows the optical losses to be limited to about 0.017 dB per bend, and a radius of curvature R of the order of 2 µm allows the optical losses to be decreased to about $1.6 \times 10^{-4}$ dB per bend.

Preferably, the average radius of curvature R is smaller than or equal to $2\lambda$. Thus, the effective length $La_{eff}$ of optical amplification is optimized, while limiting the associated optical losses. Thus, the optical losses associated with a bend of the curved section 42 may be negligible and, for example, may be lower than about $10^{-7}$ dB per bend when the radius of curvature R is equal to about 3 µm for a wavelength $\lambda$ of 2.5 µm. The length $La_{eff}$ is the length of the suspended optical amplification section 21 passed through by the optical mode. It is smaller than or equal to the length La of the suspended optical amplification section 21, and depends on the relative distance between the two curved sections 42 (see FIGS. 2B, 3A and 3B) and therefore, where appropriate, between the mode transformers 41.1, 41.2. A small average radius of curvature R thus allows the curved sections 42 to be moved apart from each other, and therefore the mode transformers 41.1, 41.2, to be moved apart from each other, thus optimizing the effective length $La_{eff}$ of optical amplification. The modal gain is therefore optimized and the optical losses associated with the curved sections 42 are limited.

The integrated waveguide 40 comprises a distal section 43 that is connected to the coupling section 41 by way of the two curved sections 42. The distal section 43 may extend longitudinally in any manner, and may incorporate additional optical modulation and/or filtering optical functions. Because of the dimensions of the curved sections 42, the integrated waveguide 40 has, both as regards the curved sections 42 and as regards the distal section 43, a minimum distance $d_{min}$ larger than or equal to zero, in orthogonal projection, with respect to the tensioning arms 30, thus limiting the risks of leakage to the tensioning arms of the optical mode circulating in the integrated waveguide 40.

The core of the integrated waveguide 40 is made from a high-index material. It is chosen so that its refractive index is close to that of the germanium-based material forming the central portion 20, so as to permit the modal coupling between the two waveguides. It is preferably based on silicon (material such as silicon, or silicon nitride SiN (e.g. $Si_3N_4$)) or may be based on a III-V compound. The cladding of the integrated waveguide 40 is formed by a low-index medium that surrounds the high-index material, for example by a silicon oxide $SiO_x$ (e.g. $SiO_2$) of the carrier layer 3 and by the medium separating the integrated waveguide 40 from the suspended waveguide. It has widthwise and/or thicknesswise transverse dimensions level with its coupling section 41 that are chosen so as to allow the modal coupling with the suspended guide 20.

In operation, the application of a potential difference to the biasing pads 6 leads to the injection of charge carriers into the tensioning arms 30 then into the optical amplification section 21 of the central portion 20. Because of the presence of a potential well formed by the tensile stress experienced by the central portion 20, the charge carriers remain confined thereto until they recombine radiatively. The same tensile stress allows the optical amplification section 21 to be given a substantially direct energy-band structure, thus improving the rate of radiative recombination. The generated optical mode then passes to and from the ring optical cavity resonantly, via evanescent-wave optical coupling between the suspended optical amplification section 21 and the coupling section 41 of the integrated waveguide 40. The light of the generated optical mode is extracted, in this example, in the suspended membrane because the degree of coupling of one mode transformer is not complete.

Thus, the resonant optical cavity is formed by the integrated ring waveguide 40, and not by optical reflectors of the Bragg-mirror type located in the tensioning arms 30 as in the aforementioned example of the prior art. Specifically, the inventors have observed that the presence of optical reflectors in the tensioning arms 30 leads to the formation of zones of concentration of stresses in proximity to the optical reflectors, and more precisely at the lateral borders of the latter. These zones of concentrations of the mechanical stresses in the suspended membrane, which are related to the presence of the optical reflectors produced in the tensioning arms 30, lead to a degradation in the mechanical properties of the tensioning arms 30 and therefore of the suspended membrane. This may also lead to a degradation in the optical and/or electronic properties of the suspended membrane and therefore of the laser source 1.

In contrast, the laser source 1 according to the embodiment, because the resonant optical cavity is formed by the integrated ring waveguide 40 and because the tensioning arms 30 therefore do not comprise any optical reflectors, has a suspended membrane the mechanical properties of which are improved with respect to the example of the prior art, thus avoiding the risk of degradation of its optical and/or electronic properties.

Moreover, the fact that the integrated ring waveguide 40 does not lie facing the tensioning arms 30, because of the arrangement of the curved sections 42, allows the risk of optical losses via a leakage of the guided mode to the tensioning arms 30 to be limited, this allowing the efficiency of the laser source 1 to be improved.

Figure 5A:
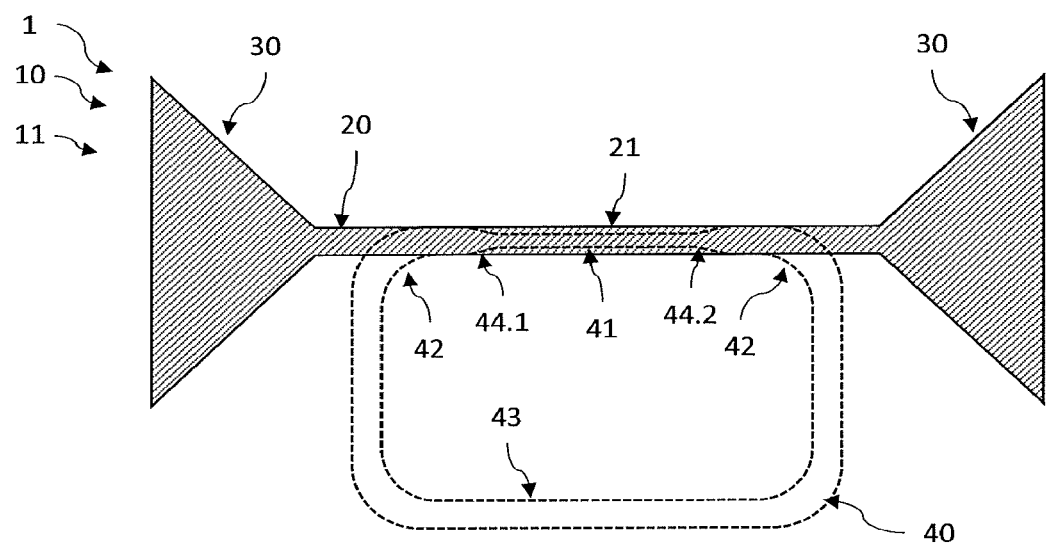
FIGS. 5A to 5C are schematic and partial top views of the laser source according to various variants of the first embodiment.
Figure 5B:
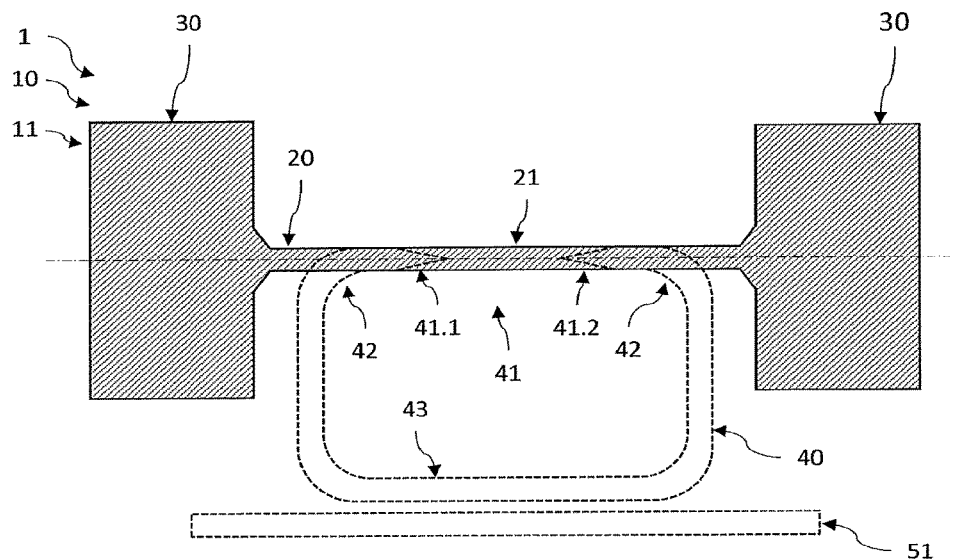
Figure 5C:
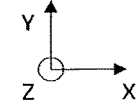
Figure 5C:
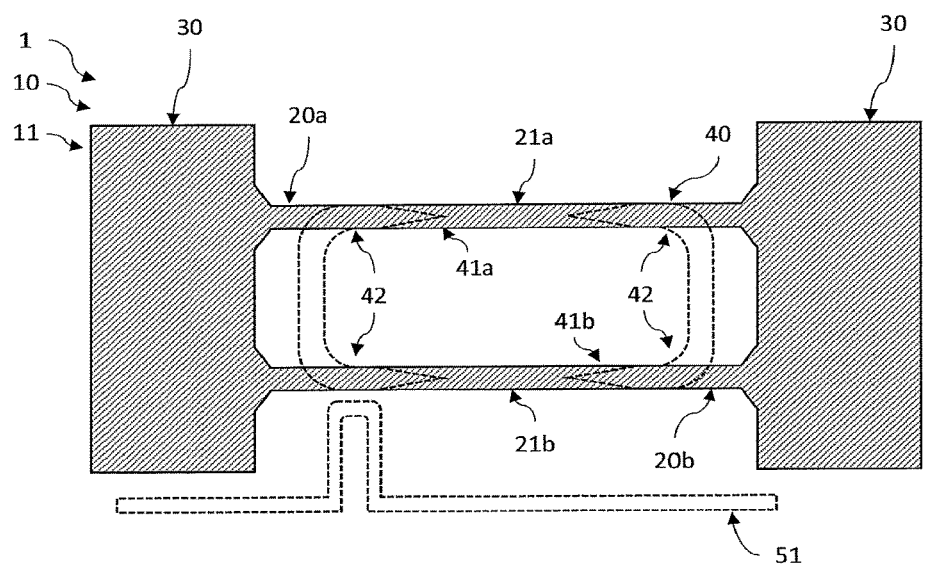

FIGS. 5A to 5C are partial schematic top views of laser sources 1 according to various variants of the embodiment. The various features of these embodiments may be combined together.

With reference to FIG. 5A, the laser source 1 according to this variant differs from that illustrated in FIG. 2A essentially in that the coupling section 41 of the integrated waveguide 40 is continuous and no longer discontinuous. It may have transverse dimensions that are constant along its longitudinal axis, but advantageously comprises two coupling zones 44.1, 44.2 that have a local variation in a transverse dimension, here the width, so that the effective index associated with the optical mode in the coupling section 41 is smaller than the effective index associated with the optical mode in the suspended optical amplification section 21. These coupling zones increase the degree of coupling between the waveguides 20, 40 and allow the supermode to spread out more in the suspended optical amplification section 21. In this example, the tensioning arms 30 have a trapezoidal shape the width of which increases with distance from the central portion 20, thus limiting the concentration of mechanical stresses at the junctions between the tensioning arms 30 and the central portion 20.

With reference to FIG. 5B, the laser source 1 according to this variant differs from that illustrated in FIG. 2A essentially in that it comprises an additional waveguide 51 allowing the light of the optical mode to be extracted. In this example, the mode transformers 41.1, 41.2 are advantageously adiabatic and provide complete coupling, so as to prevent some of the light of the optical mode from being extracted out of the suspended amplification section 21 and directly into the tensioning arms 30. The modal gain is thus maximized. Moreover, the optical coupling between the extracting waveguide 51 and the distal section 43 of the integrated waveguide 40 is partial, in order to extract some of the guided optical mode. The degree of optical coupling may be defined as the correlation between the effective indices of the guided modes supported by the integrated waveguide 40 and the extraction waveguide, and the distance separating the two waveguides. In this example, the extraction of light to the extracting waveguide 51 is bidirectional, in the sense that some of the extracted light radiation travels the waveguide 51 in one direction and some travels the waveguide 51 in the opposite direction. The light extraction may be unidirectional when the extracting waveguide 51 comprises an optical reflector, for example a Bragg mirror, placed at one of its ends.

With reference to FIG. 5C, the laser source 1 according to this variant differs from that illustrated in FIG. 2A essentially in that the suspended membrane comprises at least two central portions 20a, 20b that are parallel to one another and stretched and suspended by the same tensioning arms 30. The optical cavity is here formed by the two portions of the integrated waveguide 40 and by the two optical amplification sections 21a, 21b. The integrated waveguide 40 comprises a first coupling section 41a, here discontinuous, located under the optical amplification section 21a of a first central portion 20a, and a second coupling section 41b, here also discontinuous, located under the optical amplification section 21b of the second central portion 20b. The curved sections 42 are dimensioned so that the integrated waveguide 40 is not facing the tensioning arms 30. In this example, the light is extracted by way of an additional waveguide 51 a section of which is optically coupled to the integrated waveguide 40. The mode transformers of the two coupling sections 41a, 41b are here adiabatic and provide complete coupling, thus optimizing the modal gain while allowing light to be extracted via the guide 51. As a variant, the light may be extracted in the suspended membrane, from either one or both of the central portions 20a, 20b. To this end, as described above, at least one of the mode transformers of the coupling sections 41a, 41b is non-adiabatic and/or provides partial coupling.

An example of a process for producing a laser source 1 according to the embodiment illustrated in FIG. 2A is now described, with reference to FIGS. 6A to 6I. In this example, the suspended membrane is produced from germanium and the integrated waveguide 40 is produced from silicon in a carrier layer 3 made of silicon oxide.

Figure 6A:
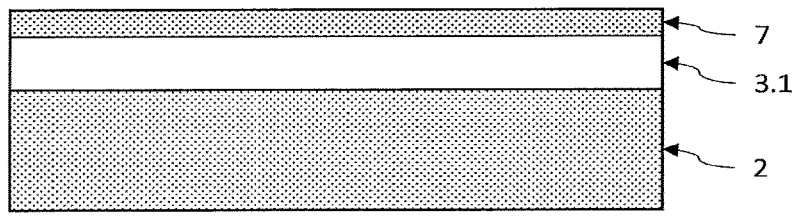
FIG. 6A to 6I are schematic and partial top views of various steps of production of the laser source according to the first embodiment illustrated in FIG. 2A.

Firstly a silicon-on-insulator (SOI) stack formed from a substrate 2 that is for example made of silicon, from an intermediate layer 3.1 that is made of silicon oxide and intended to participate in the formation of the carrier layer 3, and from an upper layer 7 that is made of silicon and intended to form the integrated waveguide 40, is provided (FIG. 6A).

Figure 6B:
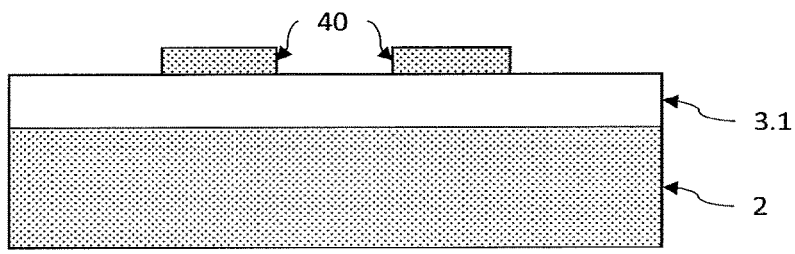

Next, the integrated waveguide 40 is formed by localized etching of the upper layer 7 (FIG. 6B). The waveguide 40 here comprises a discontinuous coupling section 41 with mode transformers, curved sections 42 located on either side of the coupling section 41, and a distal section 43 connected to the coupling section 41 by the curved sections 42 (see FIG. 6D).

Figure 6C:
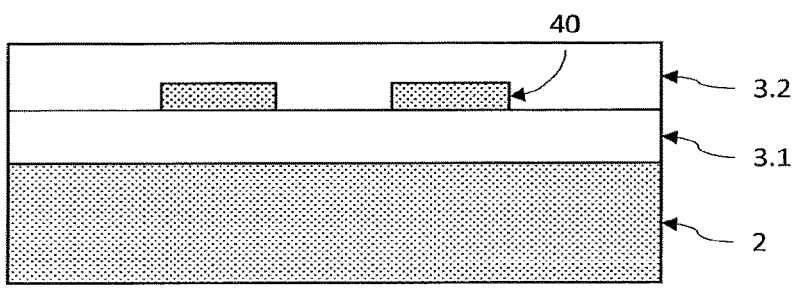
Figure 6D:
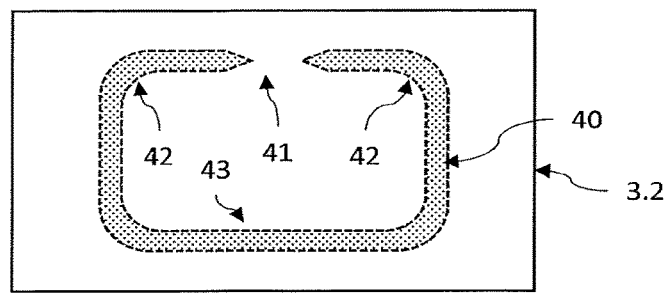

Next, an encapsulating layer 3.2 that covers the flanks of the integrated waveguide 40 is deposited (FIG. 6C). This encapsulating layer 3.2 forms, with the intermediate layer 3.1, the carrier layer 3 in which the integrated waveguide 40 is located. The encapsulating layer 3.2 and the intermediate layer 3.1 are produced from a material having the same refractive index, and are preferably produced from the same material, here $SiO_2$. In this example, the upper face of the integrated waveguide 40 is covered by the encapsulating layer 3.2.

Figure 6E:
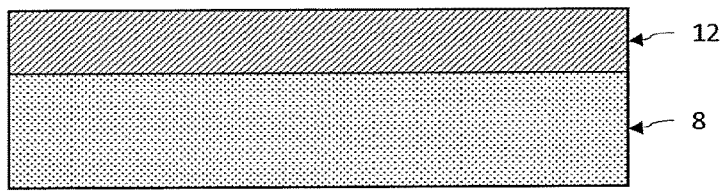
Figure 6F:
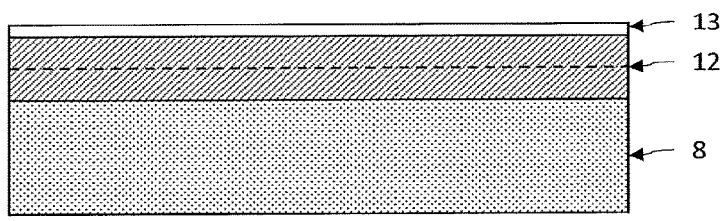

A thick germanium layer 12 intended to form the semiconductor layer 10 is produced (FIG. 6E). This thick layer 12 is produced epitaxially from a seed layer 8. It is said to be thick in the sense that its thickness is larger than the critical thickness from which mechanical stresses associated with the epitaxial growth are released by plastic relaxation. The thick layer 12 nevertheless has an initial tensile mechanical stress at the end of this production step. This step is similar to that described in patent application EP3151265.

Next, the thick germanium layer 12 it is covered (FIG. 6F) with an oxide layer 13, then $H^+$ ions are implanted into the germanium (dashed line). The implantation zone is located in the top part of the thick layer, where the layer has fewer structural defects of the dislocation type.

Figure 6G:
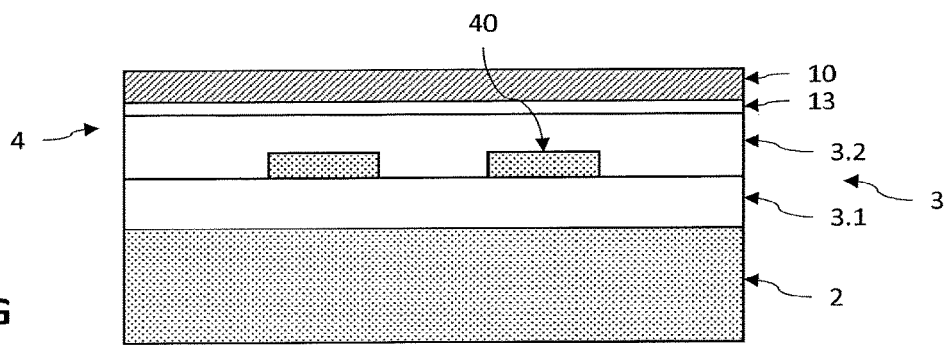

The two stacks are bonded via the oxide layers 13, 3.2 (FIG. 6G). More precisely, the oxide layer 13 covering the thick germanium layer 12 is bonded to the encapsulating layer 3.2 covering the integrated waveguide 40. The thick germanium layer 12 is fractured level with the zone weakened by the implantation of the $H^+$ ions, then chemical mechanical polishing (CMP) of the Ge-based layer is carried out. A stack formed of the semiconductor layer 10 made of germanium, covering a sacrificial layer 4 made of silicon oxide that encapsulates the integrated waveguide 40 is obtained.

Figure 6H:
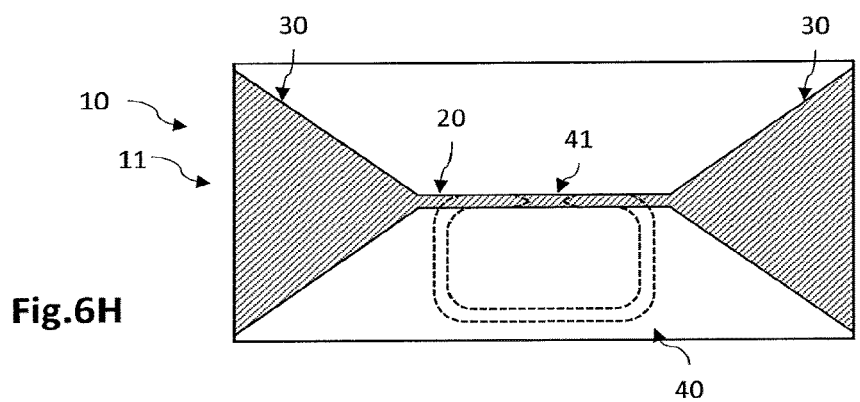

Next, the structured part 11 and the peripheral part (not shown) are defined by localized etching of the semiconductor layer 10 (FIG. 6H). The structured part 11 comprises a central portion 20 and lateral portions 30 that connects the former to the peripheral part. The central portion 20 is located facing the coupling section 41 of the integrated waveguide 40, and the lateral portions 30 are located at distance from the integrated waveguide. This position of the central portion 20 facing the coupling section 41 of the waveguide 40 may be obtained using alignment marks (not shown). Biasing pads (not shown) are then produced on the lateral portions 30.

Figure 6I:
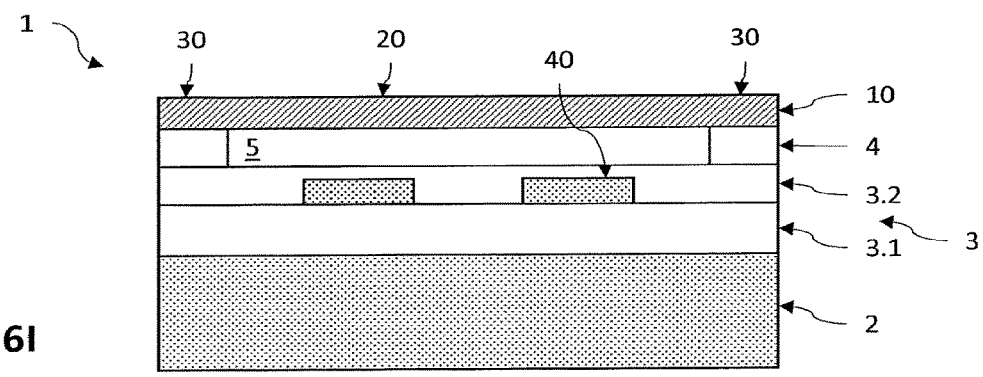

Next, the membrane is suspended by forming a cavity under the central portion 20 and the tensioning arms 30 (FIG. 6I). The cavity may be formed by wet etching of the part of the sacrificial layer 4 (encapsulating layer) that is located under the central portion 20 and the tensioning arms 30. The wet etching may be controlled by controlling its length or via a thin edge-stop layer so that part of the integrated waveguide 40 is entirely encapsulated by, or located flush with, the carrier layer 3. The suspension of the membrane leads to a controlled increase in the initial tensile stress experienced by the semiconductor layer 10, so that the central portion 20 has a final tensile stress such that the germanium therein has a substantially direct energy-band structure. Since the tensile strain experienced by the central portion 20 is higher than that possibly experienced by the tensioning arms 30, the bandgap of the germanium is decreased in the central portion 20 with respect to the tensioning arms 30, this resulting in the formation of a potential well allowing the confinement of the injected charge carriers. A conformal oxide layer, for example of $SiO_2$, may then be deposited around the central portion made of germanium in order to improve its mechanical strength. The collapse of the central section onto the oxide layer that covers the integrated waveguide 40 is also possible.

Figure 7A:
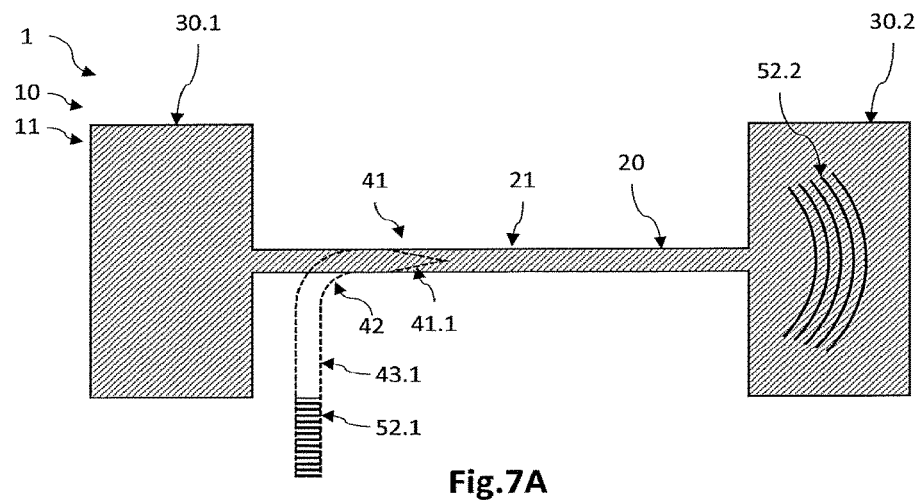
FIGS. 7A and 7B are schematic and partial top views of two variants of a laser source according to a second embodiment, in which the laser source is a distributed Bragg reflector (DBR).
Figure 7B:
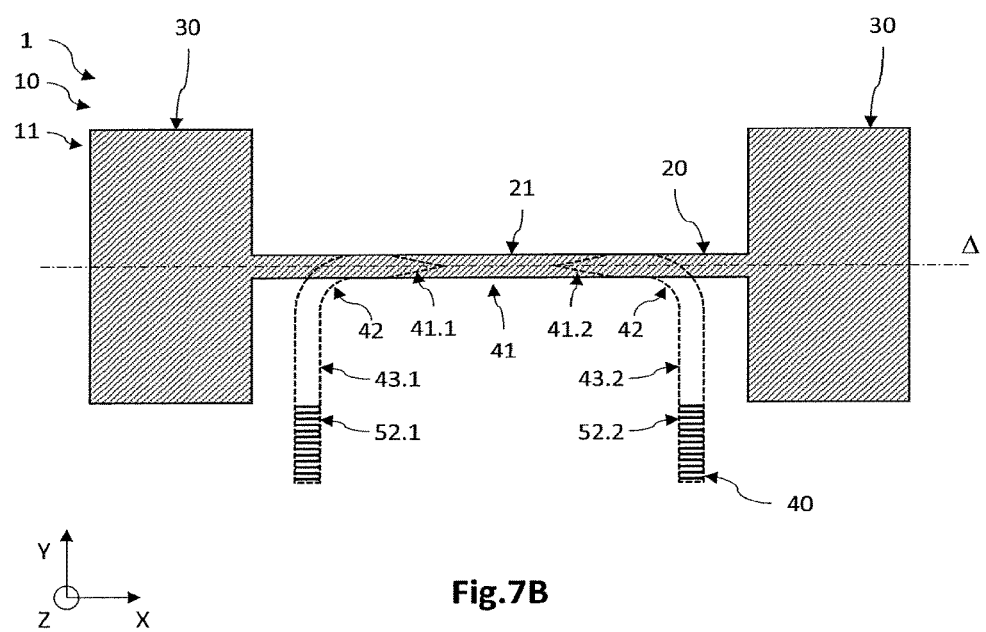

FIGS. 7A and 7B are partial schematic top views of two variants of the laser source 1 according to a second embodiment, in which the laser source is a DBR (for distributed Bragg reflector) laser source.

FIG. 7A illustrates a first variant in which the laser source 1 comprises a semiconductor layer 10 that is identical or similar to that described with reference to the first embodiment, with the exception that one tensioning arm, here the tensioning arm 30.2, comprises an optical reflector 52.2 such as a Bragg mirror. Thus, the laser source 1 according to this variant differs from that of the first embodiment essentially in that the integrated waveguide 40, which participates in forming the optical cavity, no longer has a ring shape, but instead an open longitudinal shape, i.e. the distal section 43.1 is connected only to one end of the coupling section 41 and not to both ends. Here, the optical cavity is defined by two optical reflectors 52.1, 52.2, here Bragg mirrors. In this example, a first Bragg mirror 52.1 is located in the distal section 43.1 of the integrated waveguide 40 and a second Bragg mirror 52.2 is positioned in the tensioning arm 30.2.

More precisely, in this example, the tensioning arm 30.1 does not comprise a Bragg mirror, and the tensioning arms 30.2 comprises a Bragg mirror 52.2 that is identical or similar to that described with reference to FIG. 1. In addition, the integrated waveguide 40 comprises a coupling section 41, a distal section 43.1, and a curved section 42 forming the junction between the coupling section 41 and the distal section 43.1. The coupling section 41 is here formed by a mode transformer 41.1, which is preferably adiabatic. The optical coupling may not be complete, so as to allow light to be extracted via the suspended membrane. It may as a variant be complete, in order to allow light to be extracted by way of an extracting waveguide (not shown) located in the carrier layer.

The integrated waveguide 40 here comprises only a single curved section 42 in so far as the distal section 43.1 does not close the integrated waveguide 40 onto itself, in contrast to the integrated ring waveguide 40. The distal section 43.1 comprises an optical reflector 52.1, here a Bragg mirror. The curved section 42 is arranged so that the integrated waveguide 40 does not extend under the tensioning arms 30, in particular under the tensioning arm 30.1. More precisely, it is arranged so that the integrated waveguide 40 is at distance, in orthogonal projection, from the tensioning arms 30. Thus, the optical mode is prevented from leaking into the tensioning arms.

Thus, the laser source 1 is a DBR laser source the optical amplification section 21 of which is located in the germanium-based suspended membrane, and the optical cavity of which is hybrid and defined by the optical reflectors 52.1 and 52.2. The optical mode thus travels through the optical amplification section 21 of the suspended membrane and through the integrated waveguide 40, and is reflected by the Bragg mirror 52.1 located in the distal section 43.1 of the integrated waveguide 40, and by the Bragg mirror 52.2 located in the tensioning arm 30.2.

In so far as the tensioning arms 30.1 does not comprise a Bragg mirror, the mechanical properties of the suspended membrane, and in particular those of the tensioning arm 30.1, are improved with respect to the aforementioned example of the prior art, and therefore so are the electrical and/or optical properties of the suspended membrane. The laser source 1, which is here a DBR laser source, thus has improved electrical and/or optical properties.

This embodiment is particularly advantageous when at least one Bragg mirror is located in the integrated waveguide 40. Specifically, a Bragg mirror is usually formed of a plurality of periodic local etches in the integrated waveguide 40. To obtain a Bragg mirror with a high reflectivity over a narrow wavelength range, thus contributing to making the optical cavity monochromatic, a Bragg mirror may comprise several tens or even hundreds of periods, and thus have a length of about a few tens or even hundred microns, for example a length larger than about 50 µm. Now, by way of illustration, the central portion 20 may have a length equal to about 20 µm, for which it has a good mechanical strength given the number of potential structural defects that it may contain. In addition, the coupling section 41 may have a length of about a few microns to about 10 µm, 10 µm for example, and the curved section may have a radius of curvature of about a few microns, 3 µm for example. Thus, placing the Bragg mirror 52.1 in the distal section 43.1, and therefore at distance from the tensioning arms 30 by virtue of the curved section 42, allows optical losses due to leakage of the optical mode into the tensioning arms 30 to be limited, while optimizing the modal gain by virtue of the substantial length of the optical amplification section 21, and while capitalizing upon the high reflectivity and wavelength selectivity of Bragg mirrors. In addition, by virtue of the radius of curvature of the curved section 42, which is advantageously comprised between λ/4 and 2λ, the optical amplification length and therefore the modal gain is maximized while still limiting optical losses.

FIG. 7B illustrates a second variant in which the laser source 1 differs from that illustrated in FIG. 7A essentially in that the optical cavity is defined by two optical reflectors, here Bragg mirrors 52.1, 52.2, that are each placed in one of the distal sections 43.1, 43.2 of the integrated waveguide 40, the sections being separate from each other.

Thus, the tensioning arms 30 of the suspended membrane comprise no optical reflector. The mechanical properties of the suspended membrane are thus improved with respect to those of the aforementioned example of the prior art and with respect to those of the variant illustrated in FIG. 7A. The suspended membrane, and therefore the laser source, thus has improved optical and/or electrical properties, as mentioned in above with reference to the first embodiment.

The integrated waveguide 40 thus comprises a coupling section 41, here formed of two mode transformers 41.1, 41.2, and two distal sections 43.1, 43.2 that are separate from each other in the sense that they do not meet. Curved sections 42.1, 42.2 form the junction between the mode transformers 41.1, 41.2 and the respective distal sections 43.1, 43.2. The curved sections 42.1, 42.2 are arranged so that the integrated waveguide 40 is located at distance, in orthogonal projection, from the tensioning arms 30, thus allowing the leakage of the optical mode to the tensioning arms 30 to be limited.

In so far as the optical reflectors 52.1, 52.2, here Bragg mirrors the length of which may be of the order of several tens of microns, for example 50 μm or even more in order to ensure a high reflectivity and a wavelength selectivity, are located in distal sections 43 that, by virtue of the curved sections 42, do not extend under the tensioning arms 30, a DBR laser source with a germanium-based suspended membrane and in the optical losses of which are limited is obtained. In addition, by virtue of the radius of curvature of the curved sections 42, which is advantageously comprised between λ/4 and 2λ, the optical amplification length and therefore the modal gain is maximized while still limiting optical losses.

Particular embodiments have just been described. Various variants and modifications will appear obvious to those skilled in the art. Thus, the laser source 1 according to the second embodiment may have the various types of light extraction described above, depending on the reflectivity coefficient of the Bragg mirrors, or even depending on the adiabatic character and/or the degree of coupling of the mode transformers. It may thus comprise, where appropriate, an extracting waveguide such as described above, and the suspended membrane may comprise a plurality of central portions.

The invention claimed is:

1. A laser source, comprising:
  a germanium-based semiconductor layer comprising a membrane suspended above a carrier layer, the suspended membrane being formed of:
    a central portion, which is tensilely stressed in a plane parallel to the carrier layer, comprising an optical amplification section that is configured to produce light radiation by stimulated emission, and
    a plurality of lateral portions forming tensioning arms that are opposite one another with respect to the central portion, and that are arranged so as to keep the central portion suspended and tensilely stressed, the tensioning arms having an average width larger than an average width of the central portion,
  an integrated waveguide that participates in forming an optical cavity with at least the optical amplification section, said integrated waveguide being located level with the carrier layer and at distance from the suspended membrane, and comprising:
    a coupling section, which is located facing the optical amplification section, and which is configured to allow evanescent-wave optical coupling to the optical amplification section, and
    at least one curved section that extends the coupling section, and which is arranged so that the integrated waveguide is placed at distance, in orthogonal projection, from the tensioning arms,
  wherein the coupling section comprises at least one coupling zone that has a transverse dimension that varies along the longitudinal axis of the integrated waveguide, so that an effective index of the optical mode supported by the coupling section passes locally from a value higher than an effective index of the optical mode supported by the optical amplification section to a value lower than the effective index of the optical modes supported by the optical amplification section.

2. The laser source according to claim 1, configured to emit light radiation of emission wavelength λ, wherein the integrated waveguide has a minimum distance with respect to the tensioning arms, in orthogonal protection, larger than or equal to λ/4.

3. The laser source according to claim 1, configured to emit light radiation of emission wavelength λ, wherein the curved section has an average radius of curvature larger than or equal to λ/4.

4. The laser source according to claim 1, configured to emit light radiation of emission wavelength λ, wherein the curved section has an average radius of curvature smaller than or equal to 2λ.

5. The laser source according to claim 1, wherein the integrated waveguide has a ring longitudinal shape, and comprises two curved sections which extend the coupling section and are located on either side thereof, and a distal section which is connected to the coupling section by the curved sections.

6. The laser source according to claim 1, wherein the integrated waveguide has an open longitudinal shape, and comprises a first distal section connected to the coupling section by the curved section, and which comprises a first optical reflector.

7. The laser source according to claim 6, comprising a second optical reflector located in a tensioning arm opposite to the tensioning arm in proximity to which the first distal section is located, so that the optical cavity is defined by the first optical reflector located in the first distal section and by the second optical reflector located in the second tensioning arm.

8. The laser source according to claim 6, wherein the integrated waveguide comprises a second distal section comprising a second optical reflector, said second distal section being separate from the first distal section and being connected to the coupling section by a second curved section, so that the optical cavity is defined by the first optical reflector located in the first distal section and by the second optical reflector located in the second distal section.

9. The laser source according to claim 1, wherein the coupling zone forms an adiabatic mode transformer.

10. The laser source according to claim 1, wherein the coupling of the coupling zone is partial so as to allow the light radiation to be extracted out of the optical cavity via the suspended membrane, or is complete so as to allow light radiation to be extracted out of the optical cavity by means of an extracting waveguide located level with the carrier layer and optically coupled to the integrated waveguide.

11. The laser source according to claim 1, wherein the suspended membrane comprises two zones that are doped with opposite conductivity types and that extend at least partially into the lateral portions on either side of the optical amplification section, the latter comprising a material that is unintentionally doped or doped n-type.

12. The laser source according to claim 11, wherein the integrated waveguide is located at distance, in orthogonal projection, from said doped zones.

13. The laser source according to claim 1, wherein the central portion has an average tensile mechanical stress of a sufficient value to make its energy-band structure substantially direct in the optical amplification section.

14. A process for fabricating a laser source according to claim 1, comprising the following steps:
  i) producing the integrated waveguide in the carrier layer;
  ii) producing the semiconductor layer comprising the membrane formed in the central portion and tensioning arms, so that the coupling section is located facing the optical amplification section and so that the tensioning arms are located at distance, in orthogonal projection, from the integrated waveguide;

iii) suspending the membrane, so that the central portion is tensilely stressed by the tensioning arms.

* * * * *